(12) United States Patent
Reiherzer

(10) Patent No.: US 9,343,441 B2
(45) Date of Patent: May 17, 2016

(54) LIGHT EMITTER DEVICES HAVING IMPROVED LIGHT OUTPUT AND RELATED METHODS

(75) Inventor: Jesse Colin Reiherzer, Wake Forest, NC (US)

(73) Assignee: Cree, Inc., Durham, NC (US)

( * ) Notice: Subject to any disclaimer, the term of this patent is extended or adjusted under 35 U.S.C. 154(b) by 705 days.

(21) Appl. No.: 13/444,399

(22) Filed: Apr. 11, 2012

(65) Prior Publication Data

US 2013/0207130 A1    Aug. 15, 2013

Related U.S. Application Data

(63) Continuation-in-part of application No. 13/372,063, filed on Feb. 13, 2012, now Pat. No. 8,957,580, and a continuation-in-part of application No. 13/372,076, filed on Feb. 13, 2012, now Pat. No. 8,946,747.

(51) Int. Cl.
*H01J 1/62*         (2006.01)
*H01J 63/04*        (2006.01)
(Continued)

(52) U.S. Cl.
CPC ........... *H01L 25/0753* (2013.01); *H01L 33/486* (2013.01); *H01L 33/54* (2013.01); *H01L 33/56* (2013.01); *H01L 2224/48091* (2013.01);
(Continued)

(58) Field of Classification Search
CPC ....... H01L 33/56; H01L 33/50; H01L 33/507; H01L 33/504; H01L 33/483; H01L 24/97; H01L 25/0753; C09K 11/0883; C09K 11/7721; C09K 11/7734; C09K 11/7774

USPC .......................................... 313/498–512, 112
See application file for complete search history.

(56) References Cited

U.S. PATENT DOCUMENTS 3,288,728 A    11/1966  Gorham
3,875,456 A *  4/1975   Kano et al. .................... 313/501
(Continued)

FOREIGN PATENT DOCUMENTS

EP    1536487          6/2005
EP    2056363 A2       5/2009
(Continued)

OTHER PUBLICATIONS

Restriction Requirement for U.S. Appl. No. 13/554,769 dated Oct. 9, 2013.
(Continued)

*Primary Examiner* — Nimeshkumar Patel
*Assistant Examiner* — Kevin Quarterman
(74) *Attorney, Agent, or Firm* — Jenkins, Wilson, Taylor & Hunt, P.A.

(57) ABSTRACT

Light emitter devices having improved light output and related methods are disclosed. In one embodiment, light emitter devices can include a light emission area including one or more light emitting chips. The emitter device can further include a filling material at least partially disposed over the one or more light emitting chips. The filling material can include a first discrete layer of phosphor containing material and a second discrete layer of optically clear material. The device can optionally include more than one discrete layer of optically clear material. Each of the discrete layers of material can be separately dispensed within the light emission area such that the filling material is dispensed to a level that is substantially flush with an upper surface of the emitter device.

42 Claims, 6 Drawing Sheets

(51) Int. Cl.
*H01L 25/075* (2006.01)
*H01L 33/48* (2010.01)
*H01L 33/54* (2010.01)
*H01L 33/56* (2010.01)

(52) U.S. Cl.
CPC .................. *H01L2224/48247* (2013.01); *H01L 2224/49113* (2013.01)

(56) References Cited

U.S. PATENT DOCUMENTS

| | | | |
|---|---|---|---|
| H000445 H | 3/1988 | Bock et al. | |
| 4,918,497 A | 4/1990 | Edmond | |
| 4,946,547 A | 8/1990 | Palmour | |
| 4,966,862 A | 10/1990 | Edmond | |
| 5,027,168 A | 6/1991 | Edmond | |
| 5,200,022 A | 4/1993 | Kong | |
| 5,210,051 A | 5/1993 | Carter, Jr. | |
| 5,338,944 A | 8/1994 | Edmond | |
| 5,359,345 A | 10/1994 | Hunter | |
| RE34,861 E | 2/1995 | Davis | |
| 5,393,993 A | 2/1995 | Edmond | |
| 5,416,342 A | 5/1995 | Edmond | |
| 5,523,589 A | 6/1996 | Edmond | |
| 5,604,135 A | 2/1997 | Edmond | |
| 5,631,190 A | 5/1997 | Negley | |
| 5,739,554 A | 4/1998 | Edmond | |
| 5,912,477 A | 6/1999 | Negley | |
| 5,959,316 A | 9/1999 | Lowery | |
| 6,120,600 A | 9/2000 | Edmond | |
| 6,121,637 A | 9/2000 | Isokawa et al. | |
| 6,187,606 B1 | 2/2001 | Edmond | |
| 6,201,262 B1 | 3/2001 | Edmond | |
| 6,252,254 B1 | 6/2001 | Soules et al. | |
| 6,350,041 B1 | 2/2002 | Tarsa et al. | |
| 6,576,930 B2 | 6/2003 | Reeh et al. | |
| 6,600,175 B1 | 7/2003 | Baretz | |
| 6,717,353 B1 | 4/2004 | Mueller et al. | |
| 6,791,119 B2 | 9/2004 | Slater, Jr. | |
| 6,853,010 B2 | 2/2005 | Slater, Jr. | |
| 6,860,621 B2 | 3/2005 | Bachl et al. | |
| 6,936,857 B2 | 8/2005 | Doxsee et al. | |
| 6,958,497 B2 | 10/2005 | Emerson | |
| 7,005,679 B2 * | 2/2006 | Tarsa et al. ........................ 257/89 |
| 7,087,936 B2 | 8/2006 | Negley | |
| 7,095,056 B2 | 8/2006 | Vitta | |
| 7,183,577 B2 | 2/2007 | Mueller-Mach | |
| 7,211,835 B2 | 5/2007 | Ono | |
| 7,213,940 B1 | 5/2007 | Van De Ven | |
| 7,244,965 B2 | 7/2007 | Andrews et al. | |
| 7,246,930 B2 | 7/2007 | Yatsuda et al. | |
| 7,250,715 B2 * | 7/2007 | Mueller et al. .................. 313/485 |
| 7,304,326 B2 * | 12/2007 | Suehiro et al. .................. 257/79 |
| 7,344,902 B2 | 3/2008 | Basin et al. | |
| 7,456,499 B2 | 11/2008 | Loh | |
| 7,476,909 B2 | 1/2009 | Nagai et al. | |
| 7,534,635 B1 | 5/2009 | Foust et al. | |
| 7,564,180 B2 | 7/2009 | Brandes | |
| 7,598,669 B2 | 10/2009 | Toguchi et al. | |
| 7,638,811 B2 | 12/2009 | Slater | |
| 7,655,957 B2 | 2/2010 | Loh | |
| 7,709,853 B2 | 5/2010 | Medendorp | |
| 7,791,061 B2 | 9/2010 | Edmond et al. | |
| 7,821,023 B2 | 10/2010 | Yuan et al. | |
| 7,825,575 B2 | 11/2010 | Sawanobori et al. | |
| 7,833,073 B2 | 11/2010 | Ogawa | |
| 7,842,526 B2 | 11/2010 | Hadame et al. | |
| 7,868,343 B2 | 1/2011 | Negley | |
| 7,952,115 B2 | 5/2011 | Loh | |
| 8,011,818 B2 | 9/2011 | Negley | |
| 8,052,307 B2 | 11/2011 | Bak et al. | |
| 8,058,088 B2 | 11/2011 | Cannon | |
| 8,858,022 B2 | 10/2014 | Jiang et al. | |
| 2002/0004577 A1 | 1/2002 | Biebuyck et al. | |
| 2003/0067761 A1 | 4/2003 | Horiuchi et al. | |
| 2004/0069993 A1 | 4/2004 | Murano | |
| 2004/0079957 A1 | 4/2004 | Andrews et al. | |
| 2005/0045898 A1 | 3/2005 | Leu et al. | |
| 2005/0093430 A1 | 5/2005 | Ibbetson et al. | |
| 2005/0159581 A1 | 7/2005 | Vanderzande et al. | |
| 2005/0224830 A1 | 10/2005 | Blonder et al. | |
| 2006/0091415 A1 | 5/2006 | Yan | |
| 2006/0124953 A1 | 6/2006 | Negley et al. | |
| 2006/0145172 A1 | 7/2006 | Se et al. | |
| 2006/0163589 A1 | 7/2006 | Fan et al. | |
| 2006/0181866 A1 | 8/2006 | Jung et al. | |
| 2006/0186418 A1 | 8/2006 | Edmond | |
| 2006/0221272 A1 | 10/2006 | Negley | |
| 2006/0226759 A1 * | 10/2006 | Masuda et al. .................. 313/486 |
| 2007/0012940 A1 * | 1/2007 | Suh et al. .......................... 257/99 |
| 2007/0090383 A1 | 4/2007 | Ota et al. | |
| 2007/0139923 A1 | 6/2007 | Negley | |
| 2007/0158668 A1 | 7/2007 | Tarsa | |
| 2007/0170447 A1 | 7/2007 | Negley | |
| 2007/0223219 A1 | 9/2007 | Medendorp et al. | |
| 2007/0228387 A1 | 10/2007 | Negley et al. | |
| 2007/0253209 A1 | 11/2007 | Loh | |
| 2007/0268694 A1 | 11/2007 | Bailey et al. | |
| 2008/0012036 A1 | 1/2008 | Loh | |
| 2008/0080165 A1 | 4/2008 | Kim et al. | |
| 2008/0081065 A1 | 4/2008 | Bulavin | |
| 2008/0121921 A1 | 5/2008 | Loh | |
| 2008/0173884 A1 | 7/2008 | Chitnis | |
| 2008/0179611 A1 | 7/2008 | Chitnis | |
| 2008/0198112 A1 | 8/2008 | Roberts | |
| 2008/0237616 A1 | 10/2008 | Hatakoshi et al. | |
| 2008/0239724 A1 | 10/2008 | Moriyama et al. | |
| 2008/0258130 A1 | 10/2008 | Bergmann | |
| 2008/0303052 A1 | 12/2008 | Lee et al. | |
| 2008/0308825 A1 | 12/2008 | Chakraborty | |
| 2009/0039375 A1 | 2/2009 | LeToquin | |
| 2009/0050907 A1 | 2/2009 | Yuan | |
| 2009/0050908 A1 | 2/2009 | Yuan | |
| 2009/0050924 A1 | 2/2009 | Edmond | |
| 2009/0065792 A1 | 3/2009 | Thompson et al. | |
| 2009/0080185 A1 | 3/2009 | McMillan | |
| 2009/0108281 A1 | 4/2009 | Keller et al. | |
| 2009/0179213 A1 | 7/2009 | Cannon | |
| 2009/0184616 A1 | 7/2009 | Van De Ven | |
| 2009/0194782 A1 | 8/2009 | Hata et al. | |
| 2009/0212316 A1 | 8/2009 | Braune et al. | |
| 2009/0231833 A1 | 9/2009 | Miki et al. | |
| 2009/0236621 A1 | 9/2009 | Chakraborty | |
| 2009/0236759 A1 | 9/2009 | Kashiwagi | |
| 2009/0250714 A1 * | 10/2009 | Yun et al. ........................ 257/98 |
| 2009/0261374 A1 | 10/2009 | Hayashi | |
| 2009/0283779 A1 | 11/2009 | Negley et al. | |
| 2009/0295265 A1 * | 12/2009 | Tabuchi et al. .................. 313/112 |
| 2009/0309116 A1 | 12/2009 | Kato et al. | |
| 2009/0315057 A1 | 12/2009 | Konishi et al. | |
| 2010/0025709 A1 | 2/2010 | Koseki et al. | |
| 2010/0102344 A1 | 4/2010 | Ueji | |
| 2010/0103660 A1 | 4/2010 | Van de Ven et al. | |
| 2010/0133556 A1 | 6/2010 | Li et al. | |
| 2010/0155763 A1 | 6/2010 | Donofrio | |
| 2010/0200874 A1 | 8/2010 | Shioi et al. | |
| 2010/0203657 A1 | 8/2010 | Kim | |
| 2010/0213502 A1 | 8/2010 | Kashiwagi et al. | |
| 2010/0226130 A1 | 9/2010 | Cheng et al. | |
| 2010/0237375 A1 | 9/2010 | Yamazaki et al. | |
| 2010/0252851 A1 | 10/2010 | Emerson | |
| 2010/0258830 A1 | 10/2010 | Ide et al. | |
| 2010/0283381 A1 | 11/2010 | Takahashi et al. | |
| 2010/0289395 A1 | 11/2010 | Sun et al. | |
| 2011/0001148 A1 | 1/2011 | Sun et al. | |
| 2011/0031513 A1 | 2/2011 | Hsieh et al. | |
| 2011/0046319 A1 | 2/2011 | Ueno et al. | |
| 2011/0204398 A1 | 8/2011 | Tanida et al. | |
| 2011/0220920 A1 | 9/2011 | Collins | |
| 2011/0220929 A1 | 9/2011 | Collins et al. | |
| 2011/0220939 A1 | 9/2011 | Nakayama | |
| 2011/0242806 A1 | 10/2011 | Ramer et al. | |
| 2011/0248289 A1 | 10/2011 | Hsieh et al. | |
| 2011/0253429 A1 | 10/2011 | Humphries et al. | |

(56) References Cited

U.S. PATENT DOCUMENTS

| | | |
|---|---|---|
| 2011/0272721 A1 | 11/2011 | Butterworth |
| 2012/0126257 A1 | 5/2012 | Reiherzer et al. |
| 2012/0161621 A1 | 6/2012 | Sato |
| 2012/0193649 A1 | 8/2012 | Donofrio |
| 2012/0193660 A1 | 8/2012 | Donofrio |
| 2013/0020590 A1 | 1/2013 | Lin |
| 2013/0141905 A1 | 6/2013 | Hussell |
| 2013/0141920 A1 | 6/2013 | Emerson |
| 2013/0161650 A1 | 6/2013 | Lin |
| 2013/0168719 A1 | 7/2013 | Watkins et al. |
| 2013/0207141 A1 | 8/2013 | Reiherzer |
| 2013/0207142 A1 | 8/2013 | Reiherzer |
| 2013/0208442 A1 | 8/2013 | Reiherzer |
| 2013/0214298 A1 | 8/2013 | Lin |

FOREIGN PATENT DOCUMENTS

| | | |
|---|---|---|
| EP | 2365549 A1 | 9/2011 |
| EP | 2786429 | 10/2014 |
| EP | 2791982 | 10/2014 |
| EP | 2791984 | 10/2014 |
| JP | S58 67077 A | 4/1983 |
| JP | 2001-291406 | 10/2001 |
| JP | 2003-243704 A | 8/2003 |
| JP | 2005-244226 | 9/2005 |
| JP | 2006-054209 A | 2/2006 |
| JP | 2006-245443 | 9/2006 |
| JP | 2007-266343 A | 10/2007 |
| JP | 2009-111395 | 5/2009 |
| JP | 2009-170825 | 7/2009 |
| JP | 2009-532900 A | 9/2009 |
| JP | 2009-224536 A | 10/2009 |
| JP | 2010-007013 A | 1/2010 |
| JP | 2010/092956 A | 4/2010 |
| JP | 2010-103404 | 5/2010 |
| JP | 2010-206015 A | 9/2010 |
| JP | 2010-226093 A | 10/2010 |
| JP | 2011-127011 | 6/2011 |
| JP | 2011-134508 | 7/2011 |
| KR | 10-0705552 | 4/2007 |
| KR | 10-2007-0084959 | 8/2007 |
| KR | 10-2007-0100124 | 10/2007 |
| KR | 10-2010-0079970 | 7/2010 |
| KR | 10-2010-0086955 | 8/2010 |
| KR | 10-2011-0111243 | 10/2011 |
| TW | 2008/21371 A | 5/2008 |
| TW | 2009/03859 A | 1/2009 |
| TW | 2011/09370 A | 3/2011 |
| WO | WO 2004/077580 A2 | 9/2004 |
| WO | WO 2009-107052 | 9/2009 |
| WO | WO 2010-113852 | 10/2010 |
| WO | WO 2011-109097 | 9/2011 |
| WO | WO 2013/013154 | 1/2013 |
| WO | WO 2013/082445 | 6/2013 |
| WO | WO 2013/085793 | 6/2013 |
| WO | WO 2013-085816 | 6/2013 |
| WO | WO 2013/101385 | 7/2013 |

OTHER PUBLICATIONS

Non-Final Office Action for Application No. 13/312,508 dated Dec. 17, 2013.
U.S. Appl. No. 13/372,063, filed Feb. 13, 2012.
U.S. Appl. No. 13/444,394, filed Apr. 11, 2012.
U.S. Appl. No. 13/372,076, filed Feb. 13, 2012.
U.S. Appl. No. 13/309,117, filed Dec. 1, 2011.
U.S. Appl. No. 13/554,769, filed Jul. 20, 2012.
U.S. Appl. No. 13/312,508, filed Dec. 6, 2011.
U.S. Appl. No. 13/312,518, filed Dec. 6, 2011.
U.S. Appl. No. 12/757,891, filed Apr. 9, 2010.
Ming Ma, et al., Effects of the refractive index of the encapsulant on the light-extraction efficiency of light-emitting diodes, Optics Express, Sep. 12, 2011, pp. A1135-A1140, vol. 19, No. S5.
"SCS Parylene Coatings for LEDS," Specialty Coating Systems, 2009, pp. 1-2, Indianapolis, IN, USA.
"SCS Electronic Coatings," Specialty Coating Systems, 2010, pp. 1-4, Indianapolis, IN, USA.
Restriction Requirement for U.S. Appl. No. 13/372,076 dated Jan. 31, 2013.
International Search Report and Written Opinion for Application No. PCT/US2012/047608 dated Jan. 31, 2013.
International Search Report and Written Opinion for Application No. PCT/US2012/067323 dated Mar. 15, 2013.
International Search Report and Written Opinion for Application No. PCT/US2012/067326 dated Mar. 15, 2013.
International Search Report and Written Opinion for Application No. PCT/US2012/067055 dated Mar. 28, 2013.
International Search Report and Written Opinion for Application No. PCT/US2012/067058 dated Mar. 29, 2013.
Non-Final Office Action for U.S. Appl. No. 13/372,076 dated Aug. 8, 2013.
Restriction Requirement for U.S. Appl. No. 13/309,177 dated Sep. 16, 2013.
Non-Final Office Action for U.S. Appl. No. 13/372,076 dated Mar. 18, 2014.
Non-Final Office Action for U.S. Appl. No. 13/312,518 dated Jul. 17, 2014.
Non-Final Office Action for U.S. Appl. No. 13/444,394 dated Jul. 22, 2014.
Non-Final Office Action for U.S. Appl. No. 13/372,063 dated Jul. 28, 2014.
Final Office Action for U.S. Appl. No. 13/312,508 dated Aug. 20, 2014.
Non-Final Office Action for U.S. Appl. No. 13/309,177 dated Feb. 13, 2014.
Non-Final Office Action for U.S. Appl. No. 13/312,518 dated Feb. 28, 2014.
Non-Final Office Action for U.S. Appl. No. 13/554,769 dated Mar. 18, 2014.
Restriction Requirement for U.S. Appl. No. 13/372,063 dated Apr. 10, 2014.
Restriction Requirement for U.S. Appl. No. 13/691,102 dated Apr. 11, 2014.
Non-Final Office Action for U.S. Appl. No. 13/309,177 dated Sep. 11, 2014.
Restriction Requirement for U.S. Appl. No. 13/691,102 dated Oct. 3, 2014.
Final Office Action for U.S. Appl. No. 13/554,769 dated Oct. 16, 2014.
Final Office Action for U.S. Appl. No. 13/312,518 dated Nov. 24, 2014.
Japanese Office Action for Application No. 2014/521828 dated Jan. 6, 2015.
Final Office Action for U.S. Appl. No. 13/444,394 dated Jan. 23, 2015.
Taiwanese Office Action for Application No. 101126247 dated Dec. 19, 2014.
"Press Release Nichia Corporation" posted to http://www.nichia.com/en/about_nichia/2010/2010_110201.html on Nov. 2, 2010, captured by Wayback Machine on Dec. 1, 2011, accessed on Nov. 7, 2014.
Non-Final Office Action for U.S. Appl. No. 13/312,518 dated Mar. 13, 2015.
Narukawa et al. "White light emitting diodes with super-high luminous efficacy", Journal of Physics D, 43 (2010) 354002.
Advisory Action for U.S. Appl. No. 13/554,769 dated Jan. 5, 2015.
Korean Office Action for Application No. 10-2014-7004030 dated Feb. 9, 2015.
Non-Final Office Action for U.S. Appl. No. 13/312,508 dated Feb. 18, 2015.
Non-Final Office Action for U.S. Appl. No. 13/309,177 dated Apr. 23, 2015.
Non-Final Office Action for U.S. Appl. No. 13/691,102 dated Apr. 24, 2015.
Non-Final Office Action for U.S. Appl. No. 13/554,769 dated Apr. 27, 2015.

(56) References Cited

OTHER PUBLICATIONS

Japanese Office Action for Application No. 2014-545949 dated May 19, 2015.
Notice of Allowance for U.S. Appl. No. 13/444,394 dated Jun. 5, 2015.
Korean Office Action for Application No. 10 2014 7018692 dated Jun. 9, 2015.
Korean Office Action for Application No. 10 2014 7018718 dated Jun. 10, 2015.
Supplementary European Search Report for Application No. EP 12855245 dated Jun. 12, 2015.
Extended European Search Report for Application No. EP 12863904 dated Jun. 22, 2015.
Extended European Search Report for Application No. EP 12853831 dated Jun. 22, 2015.
Notice of Allowance for U.S. Appl. No. 13/444,394 dated Jun. 29, 2015.
Final Office Action for U.S. Appl. No. 13/312,508 dated Jul. 22, 2015.

* cited by examiner

LIGHT EMITTER DEVICES HAVING IMPROVED LIGHT OUTPUT AND RELATED METHODS

CROSS REFERENCE TO RELATED APPLICATIONS

This application is a continuation-in-part from and claims priority to U.S. patent application Ser. No. 13/372,063, filed Feb. 13, 2012 now U.S. Pat. No. 8,957,580, and U.S. patent application Ser. No. 13/372,076, filed Feb. 13, 2012 now U.S. Pat. No. 8,946,747, the disclosures of which are incorporated by reference herein in their entireties.

TECHNICAL FIELD

The subject matter herein relates generally to light emitter devices and related methods. More particularly, the subject matter herein relates to light emitter devices having improved light output and related methods.

BACKGROUND

Light emitting diodes (LEDs) can be utilized in light emitter devices or packages for providing white light (e.g., perceived as being white or near-white) and are developing as replacements for incandescent, fluorescent, and metal halide high-intensity discharge (HID) light products. Conventional light emitter devices or packages employ conventional wisdom which aims at minimizing distances between the LED chips and air interface for increasing light extraction efficiency. Conventional light emitter devices also typically employ a single layer of encapsulant which may or may not contain one or more phosphors disposed therein. A need exists to provide light emitter devices with improved light output and related methods by employing improved emitter device packages, dimensions, and/or properties.

Despite the availability of various light emitter devices, a need remains for devices and components having improved brightness and light output. Light emitter devices and methods described herein can advantageously increase distances between the LED chips and air interface in part by changing the depth of packages and/or by dispensing one or more clear layers of encapsulant within the device in addition to a layer of encapsulant having phosphor disposed therein. Notably, described methods can be used and applied to create brighter surface mount device (SMD) type of light emitter devices of any style, shape, and/or dimension.

SUMMARY

In accordance with this disclosure, novel light emitter devices having improved light output are provided. It is, therefore, an object of the present disclosure herein to provide devices and methods which exhibit improved light output provided in part by provision of an additional clear layer of material deposited within a cavity of the device alone and/or in combination with increasing a depth of the cavity of the device for maximizing a distance between an LED chip and air interface. Such improvements in depth and the addition of one or more clear layers can be adapted to maximize light extraction efficiency.

This and other objects of the present disclosure as can become apparent from the disclosure herein are achieved, at least in whole or in part, by the subject matter disclosed herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
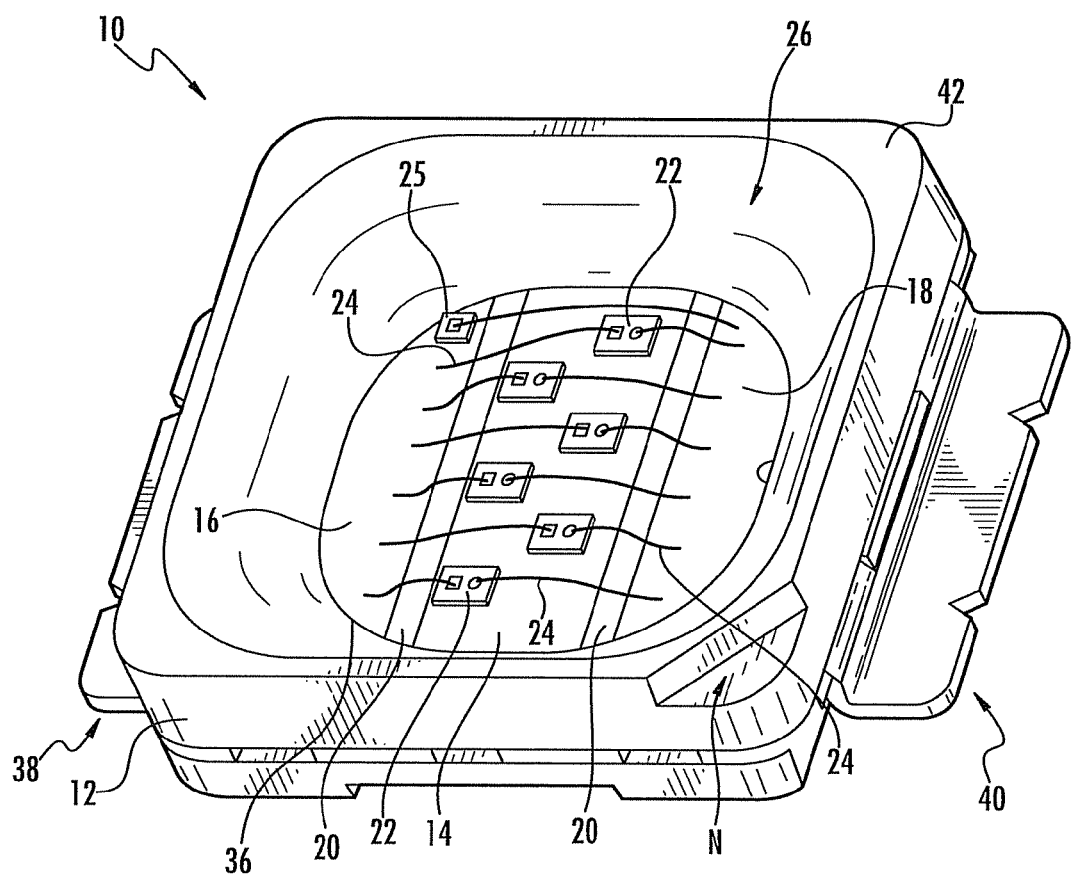
FIG. 1 is a top perspective view of a first embodiment of a light emitter device according to the disclosure herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of the other structures or portions. Like numbers refer to like elements throughout.

Unless the absence of one or more elements is specifically recited, the terms "comprising," including," and "having" as used herein should be interpreted as open-ended terms that do not preclude the presence of one or more elements.

Light emitter devices according to embodiments described herein can comprise group III-V nitride (e.g., gallium nitride (GaN)) based light emitting chips such as light emitting diode (LED) chips or lasers that can be fabricated on a growth substrate, for example, a silicon carbide (SiC) substrate, such as those devices manufactured and sold by Cree, Inc. of Durham, N.C. Other growth substrates are also contemplated herein, for example and not limited to sapphire, silicon (Si) and GaN. In one aspect, SiC substrates/layers can be 4H polytype silicon carbide substrates/layers. Other SiC candidate polytypes, such as 3C, 6H, and 15R polytypes, however, can be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties. Any other suitable growth substrates are contemplated herein.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature.

Although various embodiments of light emitting chips (e.g., LEDs or LED chips) disclosed herein comprise a growth substrate, it will be understood by those skilled in the art that the crystalline epitaxial growth substrate on which the epitaxial layers comprising an LED chip are grown can be removed, and the freestanding epitaxial layers can be mounted on a substitute carrier substrate or substrate which can have different thermal, electrical, structural and/or optical characteristics than the original substrate. The subject matter described herein is not limited to structures having crystalline epitaxial growth substrates and can be used in connection with structures in which the epitaxial layers have been removed from their original growth substrates and bonded to substitute carrier substrates.

Group III nitride based chips or LEDs according to some embodiments of the present subject matter, for example, can be fabricated on growth substrates (e.g., Si, SiC, or sapphire substrates) to provide horizontal devices (with at least two electrical contacts on a same side of the LED chip) or vertical devices (with electrical contacts on opposing sides of the LED chip). Moreover, the growth substrate can be maintained on the LED chip after fabrication or removed (e.g., by etching, grinding, polishing, etc.). The growth substrate can be removed, for example, to reduce a thickness of the resulting LED chip and/or to reduce a forward voltage through a vertical LED chip. A horizontal device (with or without the growth substrate), for example, can be flip chip bonded (e.g., using solder) to a carrier substrate or printed circuit board (PCB), or wire bonded. A vertical device (with or without the growth substrate) can have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

One or more LED chips can be at least partially coated with one or more phosphors. The phosphors can absorb a portion of light emitted from the LED chip and emit a different wavelength of light such that the light emitter device or package emits a combination of light from each of the LED chip and the phosphor. In one embodiment, the light emitter device or package emits what is perceived as white light resulting from a combination of light emission from the LED chip and the phosphor. One or more LED chips can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference in their entireties. Other suitable methods for coating one or more LED chips are described in U.S. patent application Ser. No. 12/014,404 entitled "Phosphor Coating Systems and Methods for light emitter Structures and Packaged light emitter Diodes Including Phosphor Coating" and the continuation-in-part application U.S. patent application Ser. No. 12/717,048 entitled "Systems and Methods for Application of Optical Materials to Optical Elements", the disclosures of which are hereby incorporated by reference herein in their entireties. LED chips can also be coated using other methods such electrophoretic deposition (EPD), with a suitable EPD method described in U.S. patent application Ser. No. 11/473,089 entitled "Close Loop Electrophoretic Deposition of Semiconductor Devices", which is also incorporated herein by reference in its entirety. It is understood that light emitter devices, systems, and methods according to the present subject matter can also have multiple LED chips of different colors.

Referring now to FIGS. 1 to 8, FIGS. 1 and 2 illustrate top and cross-sectional views of one example of a light emitter package or device, generally designated 10. In one aspect, light emitter device 10 can comprise a surface mount device (SMD) type of emitter device comprising a body 12 which can be molded or otherwise formed about components such as electrical leads. SMD type light emitter devices can be suitable for general LED illumination applications, such as indoor and outdoor lighting, automotive lighting, and preferably suitable for high power and/or high brightness lighting applications. The subject matter disclosed herein can be suitably adapted for application within a wide range of SMD type light emitter device designs, not limited to dimensional and/or material variations. Notably, devices and methods disclosed herein can exhibit improved light output provided in part by provision of an additional clear layer of material deposited within a cavity of the SMD type device alone and/or in combination with increasing a depth of the cavity of the device for maximizing a distance between an LED chip and air interface. Such improvements in depth and the addition of one or more clear layers can increase and maximize light extraction efficiency. Such improvements are currently not employed in the art and actually conflict with conventional wisdom employed in conventional light emitter devices which focused on minimizing (e.g., decreasing) the distance between an LED chip and air interface and providing a single layer of encapsulant with or without phosphors or phosphoric material(s). Accordingly, light emitter devices and methods disclosed herein provide unexpected results such as improved light output when employed in device design and manufacture.

In one aspect, body 12 can be disposed about electrical leads or lead components comprising a thermal element 14 and one or more electrical elements, for example, first and second electrical elements 16 and 18, respectively. That is, thermal element 14 and electrical elements 16 and 18 can be collectively referred to as a "leads" which can be singulated from a sheet of leadframes (not shown). A corner notch, generally designated N can be used for indicating electrical polarity of first and second electrical elements 16 and 18. Thermal element 14 and first and second electrical elements 16 and 18 can comprise a material that is electrically and/or thermally conductive such as a metal or metal alloy. In one aspect, thermal element 14 can be electrically and/or thermally isolated from one and/or both of first and second electrical elements 16 and 18 by one or more isolating portions 20 of the body. Thermal element 14 can also be physically separated from electrical elements 16 and 18 by isolating portions 20 of the body. One or more LED chips 22 can be mounted over thermal element 14 using any suitable die attach technique(s) and/or material(s), for example only and not limited to die attach adhesive (e.g., silicone, epoxy, or conductive silver (Ag) epoxy) or a metal-to-metal die attach technique such as flux or no-flux eutectic, non-eutectic, or thermal compression die attach.

LED chips 22 can electrically communicate with one and/or both first and second electrical elements 16 and 18 by one or more electrical connectors such as electrically conductive wire bonds 24. For illustration purposes, LED chips 22 comprise a horizontal device having two electrical contacts (e.g., anode and cathode) on the same side (e.g., upper surface) are shown as electrically connected to two electrical elements (e.g., 16 and 18) via wire bonds 24. However, LED chips 22 having one electrical contact on the upper surface that is electrically connected with a single electrical element 16 or 18 is also contemplated. In further embodiments, LED chips 22 can comprise a horizontal device having both electrical contacts on the bottom surface, where one contact could be directly attached to first electrical element 16 and the second contact could be directly attached to second electrical element 18. Any type, style, structure, build, size, and/or shape of LED chip 22 can be used in devices described herein. For example, LED chip 22 can comprise a horizontally structured chip (e.g., having at least two electrical contacts on a same side of the LED) or a vertically structured chip (e.g., with electrical contacts on opposing sides of the LED) with or without a growth substrate. LED chip 22 can comprise one or more substantially straight cut and/or beveled (i.e., angled) cut sides or surfaces.

LED chip 22 can comprise a direct attach build (e.g., bonded to a carrier substrate) or a build incorporating a grown substrate such as sapphire, SiC, or GaN. LED chips 22 can be substantially square or rectangular in shape. LED chips 22 having any build, structure, type, style, shape, and/or dimension are contemplated herein. Wire bonds 24 or other electrical attachment connectors and related methods can be adapted to communicate, transmit, or convey an electrical current or signal from electrical elements 16 and 18 to one or more LED chips 22 thereby causing illumination of the one or more LED chips 22. Thermal element 14 and/or first and second electrical elements 16 and 18, respectively, can be coated, plated, deposited, or otherwise layered with a reflective material (FIG. 2), such as, for example and without limitation, Ag or a Ag-containing alloy for reflecting light from the one or more LED chips 22.

In general, LED chips 22 as described herein can embody a solid state emitter used alone and/or in combination with one or more phosphors or lumiphors to emit light of various colors, color points, or wavelength ranges. In one aspect LED chips 22 can comprise chips selected from the following targeted wavelength bins: (1) primarily blue wavelengths (preferably approximately 430 nm to 480 nm; optionally 430-475 nm, 440-475 nm, 450-475 nm, or any suitable sub-range of 430-480 nm); (2) primarily cyan wavelengths (preferably approximately 481 nm to 499 nm); (3) primarily green wavelengths (preferably approximately 500 nm to 570 nm, optionally 505-515 nm, 515-527 nm, or 527-535 nm, or 535-570 nm, or any suitable sub-range of 500-570 nm a or any suitable sub-range of 500-570 nm); (4) primarily yellow wavelengths (preferably approximately 571 to 590 nm); and (5) primarily red wavelengths (preferably approximately 591 to 750 nm, including an optional orange sub-range (preferably approximately 591 to 620 nm), or 621-750 nm, or 621-700 nm, or 600-700 nm, or 610-700 nm, or 610-680 nm, or 620-680 nm, or 620-670 nm, and/or any suitable sub-range of 591 to 750 nm).

Figure 2:
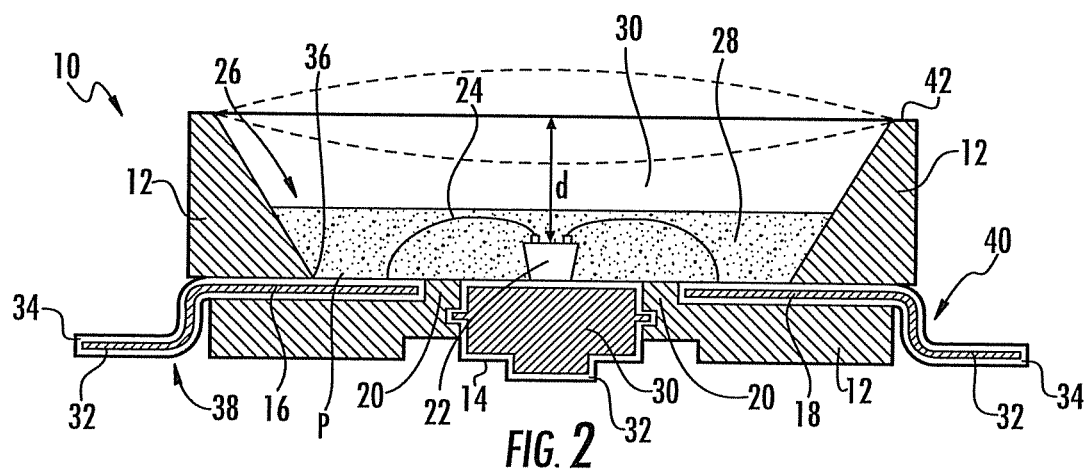
FIG. 2 is a cross-sectional view of the first embodiment of the light emitter device according to the disclosure herein.

Still referring to FIGS. 1 and 2, body 12 can comprise any suitable material molded or otherwise disposed about thermal element 14 and/or first and second elements 16 and 18, respectively. In one aspect, body 12 can comprise a ceramic material such as a low temperature co-fired ceramic (LTCC) material, a high temperature co-fired ceramic (HTCC) material, alumina, aluminum nitride (AlN), aluminum oxide ($Al_2O_3$), glass, and/or an Al panel material. In other aspects, body 12 can comprise a molded plastic material such as polyamide (PA), polyphthalamide (PPA), liquid crystal polymer (LCP), or silicone. One or more electrostatic discharge (ESD) protection devices 25 can optionally be disposed within device 10 and can be electrically connected to electrical elements 16 and 18 and reverse biased with respect to LED chips 22. Where used, ESD device 25 can protect against damage from ESD within device 10. For example, the arrangement of LED chips 22 and ESD protection device 25 allows excessive voltage and/or current passing through light emitter device 10 from an ESD event to pass through protection device 25 instead of LED chips 22 thereby protecting LED chips 22 from damage. In one aspect, different elements can be used as ESD protection devices 25 such as various vertical silicon (Si) Zener diodes, different LEDs arranged reverse biased to LED chips 22, surface mount varistors and lateral Si diodes. As illustrated, ESD device 25 can comprise a vertically structured device having one electrical contact on the bottom and another electrical contact on the top; however, horizontally structured devices are also contemplated.

Body 12 of device 10 can comprise a cavity, generally designated 26, for example, a reflector cavity optionally coated with a reflective material for reflecting light from the one or more LED chips 22. As FIG. 2 illustrates, device 10 can comprise a light emission area comprising a space or cavity 26 in which one or more LED chips 22 can be disposed. A filling material can be at least partially disposed within the cavity 26 or space and over the one or more LED chips 22. In one aspect, filling material can be dispensed to a level that is substantially flush with an upper surface of emitter device, or to any level below and/or above an upper surface of emitter device. Filling material can comprise a first discrete layer of filling material, such as an encapsulant layer 28 comprising one or more phosphors, lumiphors, and/or phosphoric or lumiphoric materials as denoted by the shaded or speckled appearance. In one aspect, the one or more phosphors can be adapted to emit light of a desired wavelength when activated by light emitted from the one or more LED chips 22. Thus, in one aspect, device 10 can emit light having a desired wavelength or color point that can be a combination of light emitted from phosphors disposed in encapsulant layer 28 and from the light emitted from one or more LED chips 22.

At least some LED chips 22 can be coated with or otherwise disposed to impinge light onto one or more phosphors disposed within encapsulant layer 28. Encapsulant layer 28 can be adapted to absorb at least some of the LED chip emissions and responsively emit light of a different wavelength. LED chip emissions can be fully absorbed or only partially absorbed such that emissions from the resulting device include a combination of light from the LED chip 22 and light from one or more phosphors. In certain embodiments, at least one of the LED chips 22 can comprise an LED that emits light in the blue wavelength spectrum, with a phosphor absorbing some of the blue light and re-emitting yellow light. The resulting LED chip 22 and phosphor combination may emit a combination of blue and yellow light appearing white or non-white. Any commercially available yellow phosphor can be used for white emitting LED chips 22 in devices described herein. In other embodiments, at least one of the LED chips 22 can comprise an LED that emits light in the blue wavelength spectrum and arranged to interact with other phosphors that absorb blue light and emit green light. Any commercially available green phosphor can be used in devices described herein.

LED chips 22 emitting red light can also be provided and used alone and/or in combination with other LED chips 22 for producing warm white light and can comprise LED structures and materials that permit emission of red light directly from the active region of the LED chip 22 (e.g., a phosphide-based active region). Alternatively, red emitting LED chips 22 can comprise LEDs covered by a phosphor that absorbs the LED light and emits a red light which can combine with other emissions for achieving warm white light. Any combination of LED chip(s) 22 and phosphor(s) wavelength emissions can be used to achieve the desired aggregated spectral output. It is understood that light emitter packages 10 and 50 (FIGS. 3-7) as described herein can include multiple LED chips 22 of the same and/or different colors, of which one or more may emit white light or near-white light.

Notably, filling material disposed in light emitter device 10 can further comprise a second discrete layer of filling material at least partially disposed above and/or below the phosphor containing encapsulant layer 28. The second layer of filling material can comprise an optically clear layer 30 of material adapted to improve light output by increasing light extraction efficiency. In one aspect, addition of clear layer 30 within device 10 improves the luminous flux by approximately 3% or more (e.g., see FIG. 8). In other aspects, addition of clear layer 30 within device 10 improves the luminous flux by approximately 3% or more (e.g., see FIG. 8). In one aspect, a single clear layer 30 can be disposed above a single encapsulant layer 28 as shown; however, more than one clear layer 30 and/or more than one encapsulant layer 28 are contemplated herein. Clear layer 30 can comprise any suitable material that is optically clear and capable of molding and/or dispensing within the light emission area or cavity 26. Clear layer 30 can comprise a layer that does not contain phosphoric or lumiphoric materials.

For example only and without limitation, clear layer 30 can comprise a layer of any suitable epoxy, silicone, or glass material. In one aspect, clear layer 30 comprises a material having a refractive index (RI) between that of the air and the chip. For example, in one aspect, clear layer 30 can comprise a low RI silicone material having a RI of approximately 1.4 or less. The RI of the silicone material can comprise any sub-range between approximately 1.0 and 1.4 such as 1.1 to 1.2; 1.2 to 1.3; and 1.3 to 1.4. In alternative embodiments, clear layer 30 can comprise a high RI silicone material having a RI of approximately 1.5 or more. That is, the RI of clear layer 30 comprising a high RI silicone material can be any sub-range between approximately 1.5 and 2.0, for example such as: 1.5 to 1.6; 1.6 to 1.7; 1.7 to 1.8; 1.8 to 1.9; and 1.9 to 2.0. Silicone materials having a medium RI of approximately 1.4 to 1.5 are also contemplated herein. In some aspects, clear layer 30 and encapsulant layer 28 can comprise the same material (e.g., both can comprise a high RI silicone, a low RI silicone, or a medium RI silicone), however, one difference being the addition of phosphor(s) to encapsulant layer 28. In other aspects, clear layer 30 and encapsulant layer 28 can comprise different materials, for example, clear layer 30 can comprise a high RI silicone and encapsulant layer 28 can comprise a low RI silicone or vice versa. Encapsulant layer 28 and clear layer 30 can comprise any suitable material capable of being dispensed and/or molded. In one embodiment, encapsulant layer 28 can be directly disposed over a portion of the LED chips 22, in other aspects, clear layer can be directly disposed over a portion of the LED chips 22 (e.g., see FIG. 6). Encapsulant layer 28, clear layer 30, and/or multiple discrete clear layers 30 can be separately and sequentially dispensed directly over each other within cavity 26 of device 10.

In one aspect, addition of clear layer 30 alone can contribute to improved light output of light emitter device 10 by reducing the amount of reabsorbed internal reflections, thereby increasing the overall luminous output of the device. In other aspects, clear layer 30 can be used in combination with an increase in the depth of cavity 26 to improve light output of light emitter device 10. For example, the depth of cavity 26 can be increased to accommodate the additional clear layer 30 such that a distance d can be increased or maximized to increase light output. Distance d can comprise a distance between the LED chip 22 and air interface. Distance d can be, but does not have to be, approximately the same for each of the plurality of LED chips 22 as the distances may vary due to process variability. Thus, in one aspect, distance d can comprise an average distance (calculated by averaging distance d for each LED chip 22) between the plurality of LED chips 22 and the air interface. In one aspect, distance d can be increased by increasing the design depth of cavity 26, for example, by increasing a wall length of cavity 26 by approximately 0.2 mm to 1.5 mm. In other aspects, distance d can be increased by downsetting the one or more LED chips 22, for example, by attaching LED chips 22 to a surface on a plane disposed below a cavity floor 36, such as over a downset thermal element 14. In one aspect, addition of clear layer 30 within device 10 can increase the distance d by approximately 0.2 mm (e.g., from 0.6 to 0.8 mm) thereby increasing brightness by approximately 1 to 3.5% (e.g., by approximately 1.5 to 4 lumens at 300 mA).

In contrast to conventional wisdom which tried to minimize distance d, maximizing the LED chip 22 to air interface, or distance d, can increase light extraction efficiency and improve light output of device 10. In some aspects, distance d can be increased to accommodate more than one clear layer 30 provided in device 10 (e.g., see FIGS. 5 to 7). Each additional clear layer 30 can increase distance d between LED chip 22 and air interface by approximately 0.2 to 0.5 mm. In one aspect, distance d can comprise approximately 0.5 to 2 mm. Notably, clear layer 30, or multiple clear layers 30 can comprise a substantially flat, non-domed layer that is not primarily useful in curving about chips to focus light. That is, clear layer 30 may not be useful for focusing light as conventional domed lenses, but can still improve light output by increasing light extraction efficiency, such as by reducing the amount or reabsorbed internal reflections and/or increasing distance d.

Still referring to FIG. 2, thermal element 14 and first and second electrical elements 16 and 18 can comprise an inner portion 32 and an outer portion 34. In one aspect, inner portion 32 and outer portion 34 can comprise electrically and/or thermally conductive materials. Outer portion 34 may be applied such that it entirely surrounds inner portion 32 as shown, or in other aspects outer portion 34 can optionally plate, coat, or comprise a layer over a single surface or two or more surfaces of portion 32. In one aspect, outer portion 34 can for example comprise a highly reflective Ag substrate, substrate containing Ag, or layer of material such as Ag for maximizing light output from device 10 and for assisting in heat dissipation by conducting heat away from the one or more LED chips 22. Outer portion 34 can also comprise a substrate of Ag-containing alloy instead of pure Ag, and such alloy can contain other metals such as titanium (Ti) or nickel (Ni). Inner portion 32 can for example comprise a metal or metal alloy such as copper (Cu) substrate or Cu-alloy substrate. In one aspect, an optional layer of material (not shown) can be disposed between inner portion 32 and outer portion 34, such as a layer of Ni for providing a barrier between the Ag and Cu, thereby preventing defects caused by migratory Cu atoms, such as a defect commonly known as "red plague". In other aspects, outer portion 34 can be directly attached to and/or directly coat inner portion 32. Outer portion 34 can advantageously reflect light emitted from the one or more LED chips 22 thereby improving optical performance of device 10.

Upper surfaces of thermal element 14 and electrical elements 16 and 18 can be disposed along a floor 36 of cavity 26 such that respective upper surfaces of thermal and electrical elements can be disposed along the same plane and/or different planes. For example, as shown, upper surfaces of thermal element 14 and electrical elements 16 and 18 are disposed along the same plane which is also the plane of floor 36. In other aspects, thermal element 14 can be downset such that an upper surface of thermal element 14 can be disposed below floor 36 such that it is below the plane of respective upper surfaces of each electrical element 16 and 18. That is, thermal element 14 can be downset such that it is disposed on a lower plane than electrical elements 16 and 18 such that thermal element 14 appears sunken in respect to electrical elements 16 and 18. First and second electrical elements 16 and 18 can extend internally through body 12 and externally from one or more lateral sides of body 12 and form one or more external tab portions, generally designated 38 and 40. Tab portions 38 and 40 can bend to form one or more lower mounting surfaces such that device 10 can be mounted to an underlying substrate. Tab portions 38 and 40 can outwardly bend away from each other or inwardly bend towards each other thereby adapting either a J-bend or gull-wing orientation as known in the art. However, any configuration of external tabs 38 and 40 is contemplated.

Still referring to FIG. 2, clear layer 30 (and/or encapsulant layer 28 depending upon which layer is on top) can be partially disposed below and/or above an upper surface 42 of device 10. In one aspect, filling material can comprise clear layer 30 disposed above encapsulant layer 28 where clear layer is filled to a level that is substantially flush with upper surface 42 of device as shown. In alternative aspects, filling material can comprise encapsulant layer 28 disposed above clear layer 30 where encapsulant layer is filled to a level that is substantially flush with upper surface 42 of device. In further aspects, the top layer (e.g., either clear or encapsulant layer 30 or 28) can be filled such that it forms a concave or convex surface with respect to upper surface 42 of device 10 as indicated by the dotted lines. One or more clear layers 30 can be at least partially disposed below upper surface 42 of device. In further aspects, one or more clear layers 30 can be entirely disposed below upper surface 42 of device. In one aspect, encapsulant layer 28 and clear layer 30 can be adapted for dispensing within cavity 26. Such layers 28 and 30 can be dispensed such that they are substantially flat and adjacent each other. That is, encapsulant layer 28 can be disposed adjacent one or more other phosphor containing layers and/or adjacent one or more clear layers. In one aspect, encapsulant layer 28 can be disposed between multiple substantially flat and non-domed clear layers 30. A single clear layer 30 can also be disposed adjacent and/or between one or more additional, substantially flat clear layers 30. As noted earlier, encapsulant layer 28 can comprise a selective amount of one or more phosphors adapted to emit light or combinations of light providing device 10 having a desired color point or color temperature.

Different thicknesses and/or volumetric percentages of encapsulant layer 28 and clear layer 30 can be deposited within cavity 26 of emitter device 10. For example and in one aspect, a volume of cavity 26 can be at least approximately 25% filled with encapsulant layer 28 and at least approximately 25% filled with clear layer 30. For example, at least approximately 25% of a total cavity volume can be filled with encapsulant layer 28 and at least approximately 75% of the total cavity volume can be filled with clear layer 30 such that approximately 100% of the total cavity volume is filled (i.e., dispensed) to a level that is approximately flush with upper surface 42 of device 10. In other aspects, the volume of cavity 26 can be approximately 50% filled with encapsulant layer 28 and approximately 50% filled with clear layer 30, such that approximately 100% of the cavity is filled approximately flush with upper surface 42 of device 10. In still further aspects, the volume of cavity 26 can be approximately 75% filled with encapsulant layer 28 and approximately 25% filled with clear layer 30, such that approximately 100% of the total cavity volume is filled approximately flush with upper surface 42 of device 10.

The volume of cavity 26 can be filled to any desired percentage (e.g., over-filled above upper surface 42 beyond 100% or under-filled below upper surface 42 and below 100%) and any combination or variation of volumetric percentages between encapsulant layer 28 and clear layer 30 within cavity 26 is contemplated herein. In one aspect, encapsulant layer 28 and clear layer 30 can comprise approximately the same thickness, in other aspects, one of encapsulant layer 28 or clear layer 30 can be thicker than the other layer. For example, in one aspect encapsulant layer 28 and clear layer 30 can each comprise approximately 0.4 mm, and each subsequent layer (where used, see e.g., FIGS. 5-7) can comprise approximately 0.2 to 0.3 mm in thickness. In one aspect, a device having just encapsulant layer 28 can comprise a distance d of approximately 0.4 mm while a device as described herein having three clear layers (e.g., FIG. 7) can comprise a distance d of approximately 0.5 to 2 mm including any sub range thereof such as 0.5 to 1 mm; 1 to 1.2 mm; 1.2 to 01.4 mm; 1.4 to 1.5 mm; 1.5 to 2 mm, and in some instances, greater than 2 mm.

In some aspects, encapsulant layer 28 can completely cover wirebonds 24, while in other aspects, wire bonds 24 can be completely covered by clear layer 30. In yet further aspects, wire bonds 24 are completely covered by a combination of encapsulant layer 28 and clear layer 30. During manufacture of device 10, a first layer (e.g., either encapsulant layer 28 or clear layer 30) can be deposited in cavity 26 first and then subsequently cured prior to dispensing the second layer (e.g., the remaining encapsulant layer 28 or clear layer 30) such that the second deposited layer can undergo a separate curing step at a different time and/or temperature. In other aspects, encapsulant layer 28 and clear layer 30 can be sequentially dispensed within cavity 26 such that they are directly adjacent each other and can be cured at the same time. That is, multiple dispense and multiple curing steps (i.e., separately dispensing and curing of encapsulant layer 28 and clear layer 30) are contemplated herein, or multiple dispense and one curing step (i.e., separately dispensing and simultaneous curing of encapsulant layer 28 and clear layer 30) are contemplated herein. Notably, the various devices shown and described herein can comprise an additional, discrete clear layer 30 that is physically separate from a phosphor containing encapsulant layer 28 for improving light output by increasing efficiency of light extraction. Devices can also advantageously provide an improved and increased distance d between the LED chip 22 and air interface for improving light output, as maximizing this distance can further increase light extraction efficiency.

Figure 3:
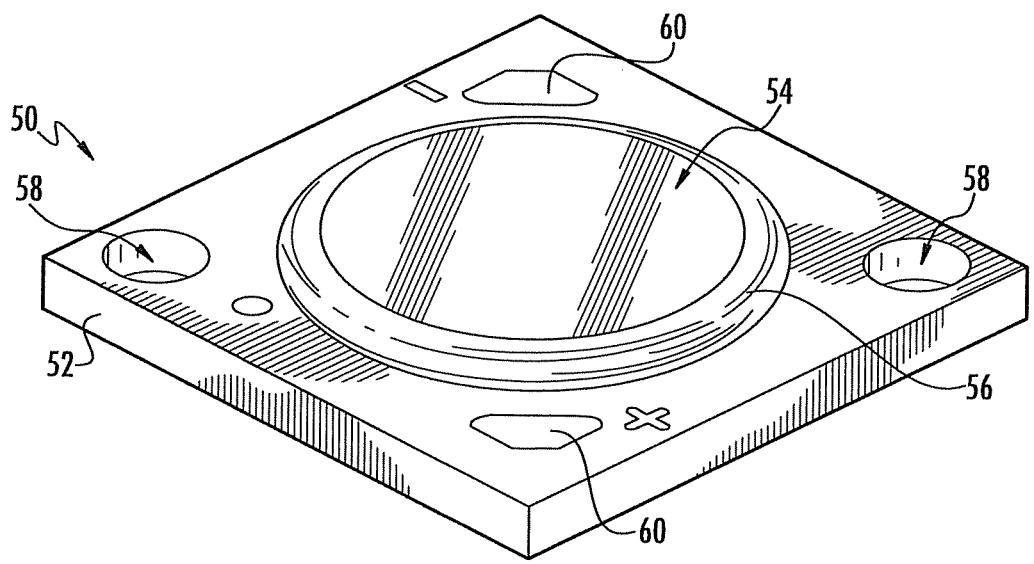
FIG. 3 is a top perspective view of a second embodiment of a light emitter device according to the disclosure herein.
Figure 4:
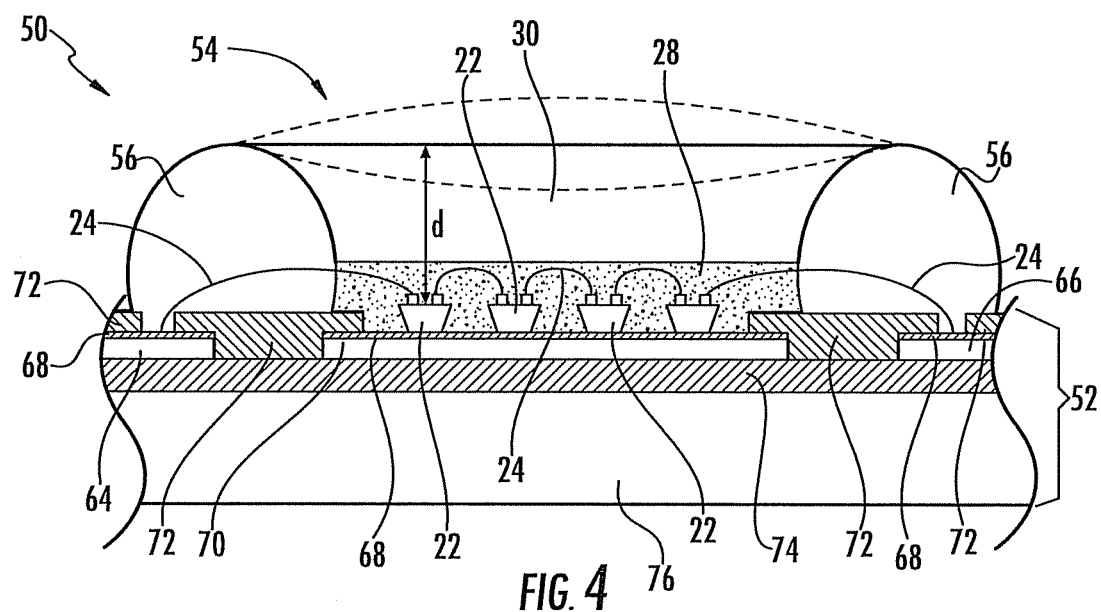
FIG. 4 is a cross-sectional view of the second embodiment of the light emitter device according to the disclosure herein.

FIGS. 3 and 4 illustrate top perspective and cross-sectional views of another embodiment of a light emitter package or device, generally designated 50. Light emitter device 50 can also incorporate an optically clear layer 30 (FIG. 4) that is physically separate or discrete from a phosphor containing encapsulant layer 28. Clear layer 30 can increase light extraction efficiency in part by reducing the amount or reabsorbed internal reflections, thereby improving light output of device 50. Light emitter device 50 can comprise an SMD type device, similar to device 10. Light emitter device 50 can comprise a submount 52 over which an emission area, generally designated 54, can be disposed. A light emission area 54 can comprise a cavity or space in which one or more LED chips 22 can be disposed under a first layer of filling material, such as an encapsulant layer 28 (see FIG. 4). As previously described, LED chips 22 can comprise a plurality of chips adapted to emit the same color or targeted wavelength of lights, or at least one of the plurality of LED chips 22 can be adapted to emit light that is a different color (e.g., from a different targeted wavelength bin) than a second LED of the plurality of LED chips 22. In one aspect, a single LED chip 22 is contemplated for use in emitter devices described herein. LED chips 22 can be configured to emit light having wavelengths in the visible spectrum portion of the electromagnetic spectrum in any of the previously described colors and/or wavelength ranges. Also as described above, encapsulant layer 28 can comprise phosphors adapted to emit light in any color, for example, yellow, green, and/or red when activated by emissions from the one or more LED chips 22. Any combination of LED chip 22 and phosphor colors or targeted wavelength ranges are contemplated herein for producing white light, cool white light, and/or warm white light.

In one aspect, emission area 54 can be substantially centrally disposed with respect to submount 52 of light emitter device 50. In the alternative, emission area 54 can be disposed at any location over light emitter device 50, for example, in a corner or adjacent an edge. Any location is contemplated, and more than one emission area 54 is also contemplated. For illustration purposes, a single, circular emission area 54 is shown; however, the number, size, shape, and/or location of emission area 54 can change subject to the discretion of light emitter device consumers, manufacturers, and/or designers. Emission area 54 can comprise any suitable shape such as a substantially circular, square, oval, rectangular, diamond, irregular, regular, or asymmetrical shape. Light emitter device 50 can further comprise a retention material 56 at least partially disposed about emission area 54 where retention material 56 can be referred to as a dam. Retention material 56 can comprise any material such as a silicone, ceramic, thermoplastic, and/or thermosetting polymer material. In one aspect, retention material 56 is adapted for dispensing about emission area 54, which can be advantageous as it is easy to apply and easy to obtain any desired size and/or shape.

Submount 52 can comprise any suitable mounting substrate, for example, a printed circuit board (PCB), a metal core printed circuit board (MCPCB), an external circuit, a dielectric laminate panel, a ceramic panel, an Al panel, AlN, $Al_2O_3$, or any other suitable substrate over which lighting devices such as LED chips may mount and/or attach. LED chips 22 disposed in emission area 54 can electrically and/or thermally communicate with electrical elements disposed with submount 52, for example, electrically conductive traces (e.g., 64, 66 of FIG. 4). Emission area 54 can comprise a single and/or a plurality of LED chips 22 disposed within and/or below encapsulant layer 28 such as illustrated in FIG. 4. Notably, emission area 54 of light emitter device 50 can further comprise a second layer of filling material at least partially disposed above and/or below the phosphor containing encapsulant layer 28. The second layer of filling material can comprise an optically clear layer 30 (FIG. 4) of material adapted to improve light output by increasing light extraction efficiency. LED chips 22 can comprise any suitable size and/or shape of chip and can be vertically structured (e.g., electrical contacts on opposing sides) and/or horizontally structured (e.g., contacts on the same side or surface).

LED chips 22 can be any style of chip for example, straight cut and/or bevel cut chips, a sapphire, SiC, or GaN growth substrate or no substrate. One or more LED chips 22 can form a multi-chip array of LED chips 22 electrically connected to each other and/or electrically conductive traces in combinations of series and parallel configurations. In one aspect, LED chips 22 can be arranged in one or more strings of LEDs, where each string can comprise more than one LED electrically connected in series. Strings of LED chips 22 can be electrically connected in parallel to other strings of LED chips 22. Strings of LED chips 22 can be arranged in one or more pattern (not shown). LED chips 22 can be electrically connected to other LEDs in series, parallel, and/or combinations of series and parallel arrangements depending upon the application.

Referring to FIG. 3, light emitter device 50 can further comprise at least one opening or hole, generally designated 58, that can be disposed through or at least partially through submount 52 for facilitating attachment of light emitter device 50 to an external substrate, circuit, or surface. For example, one or more screws can be inserted through the at least one hole 58 for securing device 50 to another member, structure, or substrate. Light emitter device 50 can also comprise one or more electrical attachment surfaces 60. In one aspect, attachment surfaces 60 comprise electrical contacts such as solder contacts or connectors. Attachment surfaces 60 can be any suitable configuration, size, shape and/or location and can comprise positive and negative electrode terminals, denoted by the "+" and/or "−" signs on respective sides of device 50, through which an electrical current or signal can pass when connected to an external power source.

One or more external electrically conductive wires (not shown) can be physically and electrically attached to attachment surfaces 60 by welding, soldering, clamping, crimping, inserting, or using any other suitable gas-tight solder free attachment method known in the art. That is, in some aspects, attachment surfaces 60 can comprise devices configured to clamp, crimp, or otherwise attach to external wires (not shown). Electrical current or signal can pass into light emitter device 50 from the external wires electrically connected to device 50 at the attachment surfaces 60. Electrical current can flow into the emission area 54 to facilitate light output from the LED chips 22 disposed therein (FIG. 4). Attachment surfaces 60 can electrically communicate with LED chips 22 of emission area 54 via conductive traces 64 and 66 (FIG. 4). That is, in one aspect attachment surfaces 60 can comprise a same layer of material as first and second conductive traces 64 and 66 (FIG. 4) and therefore can electrically communicate to LED chips 22 attached to traces 64 and 66 via electrical connectors such as wire bonds 24. Electrical connectors can comprise wire bonds 24 or other suitable members for electrically connecting LED chips 22 to first and second conductive traces 64 and 66 (FIG. 4). That is, in one aspect LED chips 22 (FIG. 4) can comprise horizontally structured devices having both electrical contacts (e.g., anode and cathode) on the same top surface of respective LED chip 22 such that the contacts (e.g., bond pads) can electrically connect with traces (e.g., 64 and 66, FIG. 4) via wire bonds 24. In other aspects, LED chips 22 can comprise horizontal devices having both electrical contacts (e.g., anode and cathode) on a bottom surface such that wire bonds 24 are unnecessary. In further aspects, LED chips 22 can comprise vertical devices having electrical contacts on opposing sides such that one wire bond 24 is needed. Any type or structure of LED chip 22 is contemplated herein.

As shown in FIG. 4, a first layer of filling material can comprise a phosphor containing encapsulant layer 28 that can be disposed between inner walls of retention material 56. Encapsulant layer 28 can comprise a predetermined, or selective, amount of one or more phosphors and/or lumiphors in an amount suitable for any desired light emission, for example, suitable for white light conversion or any given color temperature or color point. Encapsulant layer 28 can comprise a silicone encapsulant material, such as a low RI, high RI, or medium RI silicone material having the one or more phosphors disposed therein. Encapsulant layer 28 can interact with light emitted from the plurality of LED chips 22 such that a perceived white light, or any suitable and/or desirable wavelength of light, can be observed. Any suitable combination of encapsulant and/or phosphors can be used, and combinations of differently colored phosphors and/or LED chips 22 can be used for producing any desired color points(s) of light. Retention material 56 can be adapted for dispensing, positioning, damming, or placing, about at least a portion of emission area 54.

Notably, light emitter device 50 can further comprise a second layer of filling material at least partially disposed above and/or below the phosphor containing encapsulant layer 28. The second layer of filling material can comprise a discrete layer of the previously described optically clear layer 30 of material adapted to improve light output by increasing light extraction efficiency. In one aspect, the addition of clear layer 30 within device 50 can improve the luminous flux by approximately 3% and in some cases by more than 5% (e.g., see FIG. 8). In one aspect, a single clear layer 30 can be disposed above a single encapsulant layer 28 as shown, however, more than one clear layer 30 (e.g. FIGS. 5-7) and/or more than one encapsulant layer 28 are contemplated herein. Clear layer 30 can comprise any suitable material that is optically clear and capable of molding and/or dispensing within cavity 26. Clear layer 30 can comprise a layer that does not contain phosphoric or lumiphoric materials and can, but does not have to, comprise the same material as encapsulant layer 28 without the phosphoric or lumiphoric materials. For example only and without limitation, clear layer 30 can comprise a layer of any suitable epoxy, silicone, or glass material. In one aspect, clear layer 30 comprises a material having a refractive index (RI) between that of the air and the chip. For example, in one aspect, clear layer 30 can comprise a low RI silicone material having a RI of approximately 1.4 or less. The RI of the silicone material can comprise any sub-range between approximately 1.0 and 1.4 such as 1.1 to 1.2; 1.2 to 1.3; and 1.3 to 1.4. In alternative embodiments, clear layer 30 can comprise a high RI silicone material having a RI of approximately 1.5 or more. That is, the RI of clear layer 30 comprising a high RI silicone material can comprise any sub-range between approximately 1.5 and 2.0, for example such as: 1.5 to 1.6; 1.6 to 1.7; 1.7 to 1.8; 1.8 to 1.9; and 1.9 to 2.0. Silicone materials having a medium RI of approximately 1.4 to 1.5 are also contemplated herein.

In one aspect, addition of clear layer 30 alone can contribute to improved light output of light emitter device 10 by reducing the amount of reabsorbed internal reflections, thereby increasing the overall luminous output of the device. In other aspects, clear layer 30 can be used in combination with an increase in the depth of emission area 54 to improve light output of light emitter device 50. For example, the depth of emission area 54 can be increased to accommodate the additional clear layer 30 such that a distance d can be increased or maximized to increase light output. Distance d can be a distance between the LED chip 22 and air interface. In one aspect, distance d can be increased by increasing the height of retention material 56. In other aspects, distance d can be increased by incorporating a secondary dam structure (e.g., 82, FIG. 7) which can increase the depth of emission area 54. In contrast to conventional wisdom, maximizing the distance between LED chip 22 to the air interface, or distance d, can increase light extraction efficiency and improve light output of device 50. In some aspects, distance d can be increased to accommodate more than one clear layer 30 provided in device 50 (e.g., see FIGS. 5 to 7). Each additional clear layer 30 can increase distance d between LED chip 22 and air interface for example by approximately 0.2 to 0.5 mm. In one aspect, distance d can comprise a total distance between approximately 0.5 and 2 mm.

After placement of retention material 56, encapsulant layer 28 and clear layer 30 can be selectively filled to any suitable level within the space disposed between one or more inner walls of retention material 56. Different percentages and/or volumes of encapsulant layer 28 and clear layer 30 can be deposited within emission area 54 of emitter device 50. In one aspect, the volume of emission area 54 can be at least approximately 25% filled with encapsulant layer 28 and at least approximately 25% filled with clear layer 30. For example, at least approximately 25% of a cavity volume can be filled with encapsulant layer 28 and at least approximately 75% of the cavity volume can be filled with clear layer 30 such that approximately 100% of the emission area 54 can be filled (i.e., dispensed) to a level that is approximately flush with upper surface of device 50 (e.g., approximately flush with an upper surface of retention material 56). In other aspects, the volume of emission area 54 can be approximately 50% filled with encapsulant layer 28 and approximately 50% filled with clear layer 30, such that approximately 100% of the emission area 54 is filled approximately flush with the upper surface of retention material 56. In still further aspects, the volume of emission area 54 can be approximately 75% filled with encapsulant layer 28 and approximately 25% filled with clear layer 30, such that approximately 100% of the emission area 54 is filled approximately flush with upper surface of retention material 56. Any volume of emission area 54 can be filled to any percentage level (e.g., over-filled above upper surface of retention material 56 beyond 100% or under-filled below upper surface of retention material 56 and below 100%) and any combination or variation of volumetric percentages of encapsulant layer 28 and clear layer 30 is contemplated herein. As denoted by the dotted lines, filling material can be over-filled and/or under-filled resulting in concave and/or convex surfaces between walls of retention material 56. Any combination of thicknesses and/or volumes of filling materials can be used, for example, encapsulant layer 28 can comprise a thickness within the cavity of between approximately 0 and 2 mm alone and/or in combination with clear layer 30 which can also comprise a thickness within the cavity of between approximately 0 and 2 mm.

As described earlier and in some aspects, encapsulant layer 28 can completely cover wirebonds 24, while in other aspects wire bonds 24 can be completely covered by clear layer 30. In yet further aspects, wire bonds 24 can be covered by a combination of encapsulant layer 28 and clear layer 30. During manufacture of device 50, a first layer (e.g., either encapsulant layer 28 or clear layer 30) can be deposited in emission area 54 first and then subsequently cured prior to dispensing the second layer (e.g., the remaining encapsulant layer 28 or clear layer 30) such that the second deposited layer can undergo a separate curing step. In other aspects, encapsulant layer 28 and clear layer 30 can be sequentially dispensed in emission area 54 and cured at the same time. That is, multiple dispense and multiple curing steps (i.e., separately dispensing and curing of encapsulant layer 28 and clear layer 30) can be used, or multiple dispense and one curing step (i.e., separately dispensing and simultaneous curing of encapsulant layer 28 and clear layer 30) can be used. Notably, the various devices, for example, SMD type devices shown and described herein, can comprise an additional, clear layer 30 that is physically separate from a phosphor containing encapsulant layer 28 for improving light output by increasing efficiency of light extraction. The devices can also advantageously provide an improved and increased distance d between the LED chip 22 and air interface for improving light output, as maximizing this distance can further increase light extraction efficiency.

FIG. 4 further illustrates retention material 56 dispensed or otherwise placed over submount 52 after wire bonding the one or more LED chips 22 such that retention material 56 is disposed over and at least partially covers at least a portion of the wire bonds 24. For example, wire bonds 24 of the outermost edge LEDs in a given set or string of LED chips 22 can be disposed within retention material 14. For illustration purposes, only four LED chips 22 are illustrated and are shown as electrically connected in series via wire bonds 24, however, many strings of LED chips 22 of any number can be used, for example, less than four or more than four LED chips 22 can be electrically connected in series, parallel, and/or combinations of series and parallel arrangements. Strings of LED chips 22 can comprise diodes of the same and/or different colors, or wavelength bins, and different colors of phosphors can be used in the encapsulant layer 28 disposed over LED chips 22 that are the same or different colors in order to achieve emitted light of a desired color temperature or color point. LED chips 22 can attach to a conductive pad 70 or intervening layers (e.g., layer 68 described below) disposed between LED chip 22 and conductive pad 70 using any die attach technique or materials as known in art and mentioned above, for example adhesive attach, metal or silicone epoxy attach, solder attach, flux-attach, or direct metal-to-metal die attach techniques and materials as known in the art.

LED chips 22 can be arranged, disposed, or mounted over an electrically and/or thermally conductive pad 70. Conductive pad 70 can be electrically and/or thermally conductive and can comprise any suitable electrically and/or thermally conducting material. In one aspect, conductive pad 70 can comprise a layer of Cu or a Cu substrate. LED chips 22 can be electrically connected to first and second conductive traces 64 and 66 via optional wire bonds 24. One of first and second conductive traces 64 and 66 can comprise an anode and the other a cathode. Conductive traces 64 and 66 can also comprise a layer of electrically conductive Cu or Cu substrate. In one aspect, conductive pad 70 and traces 64 and 66 can comprise the same Cu substrate from which traces 64 and 66 have been singulated or separated from pad 70 via etching or other removal method. After etching, an electrically insulating solder mask 72 can be applied such that it is at least partially disposed between conductive pad 70 and respective conductive traces 64 and 66. Solder mask 72 can comprise a white material for reflecting light from light emitter device 50. One or more layers of material can be disposed between LED chips 22 and conductive pad 70. Similarly, one or more layers of material can be disposed over conductive traces 64 and 66. For example and in one aspect, a first intervening layer or substrate of material 68 can be disposed between LED chips 22 and conductive pad 70 and disposed over traces 64 and 66. First layer of material 68 can comprise a layer of reflective Ag or Ag-alloy material for maximizing brightness of light emitted from light emitter device 50. That is, first layer of material 68 can comprise a Ag or Ag-containing substrate adapted to increase brightness of device 50. One or more additional layers of material (not shown) can be disposed between first layer 68 and conductive pad 70 and/or first layer 68 and traces 64 and 66, for example, a layer of Ni, can be disposed therebetween for providing a barrier between the Cu of pad and traces 70, 64, and 66 and the Ag of layer 68.

FIG. 4 further illustrates a cross-section of submount 52 over which LED chips 22 can be mounted or otherwise arranged. Submount 52 can comprise, for example, conductive pad 70, first and second conductive traces 64 and 66, and solder mask 72 at least partially disposed between conductive pad 70 and each of conductive traces 64 and/or 66. Conductive traces 64, 66 and conductive pad 70 can be coated with a first layer 68, for example a Ag or Ag-containing layer. Submount 52 can further comprise a dielectric layer 74, and a core layer 76. In one aspect, solder mask 72 can directly adhere to portions of dielectric layer 74. For illustration purposes, submount 52 can comprise a MCPCB, for example, those available and manufactured by The Bergquist Company of Chanhassan, Minn. Any suitable submount 52 can be used, however. Core layer 76 can comprise a conductive metal layer, for example copper or aluminum. Dielectric layer 74 can comprise an electrically insulating but thermally conductive material to assist with heat dissipation through submount 52.

Figure 5:
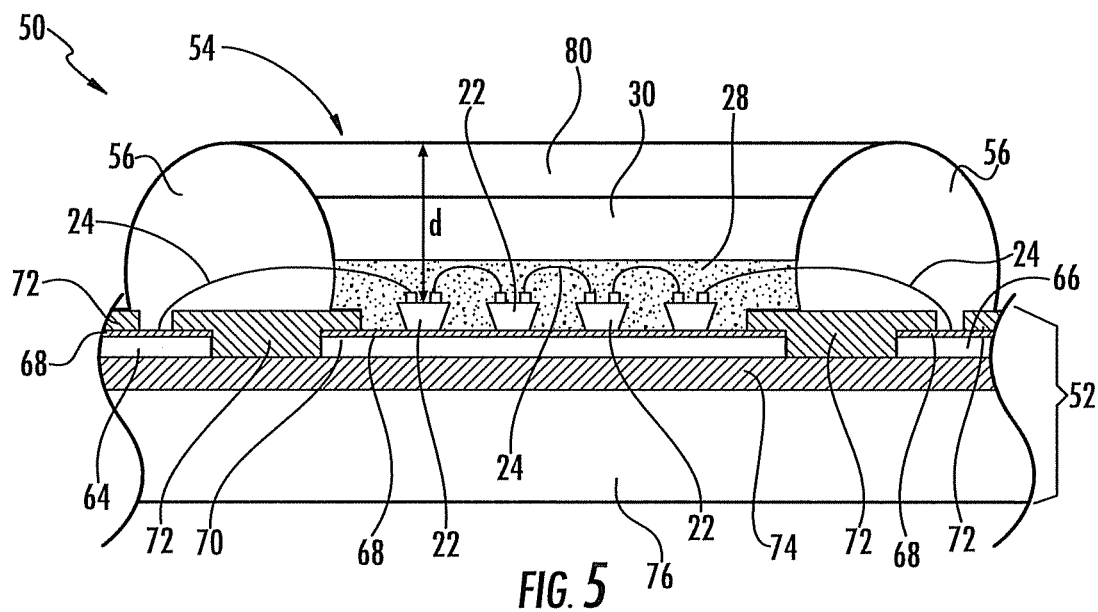
FIGS. 5 through 7 are cross-sectional views of light emitter devices according to the disclosure herein.
Figure 6:
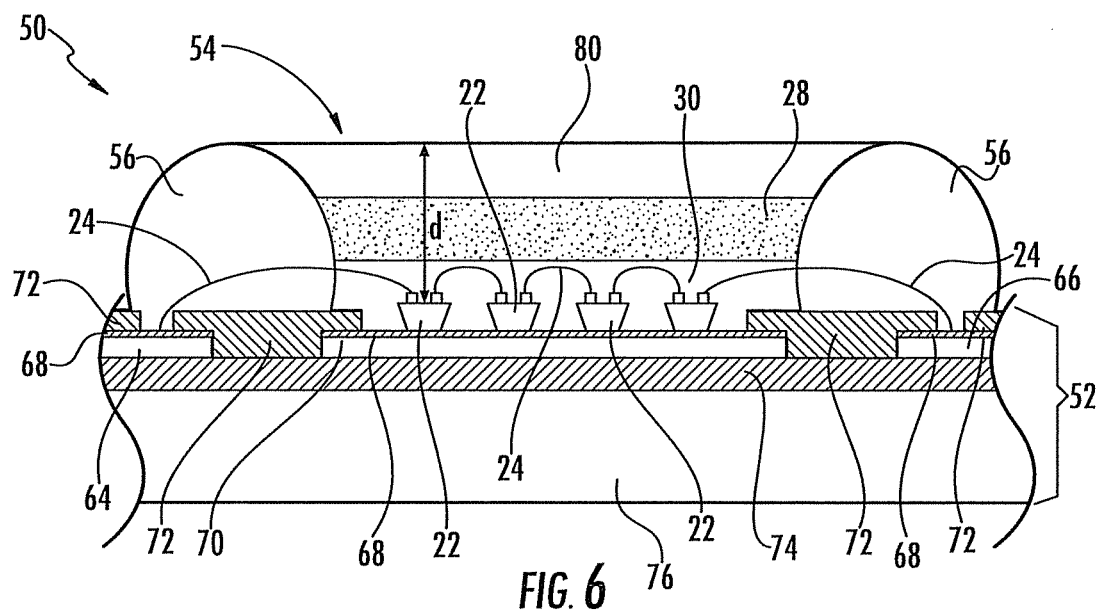
Figure 7:
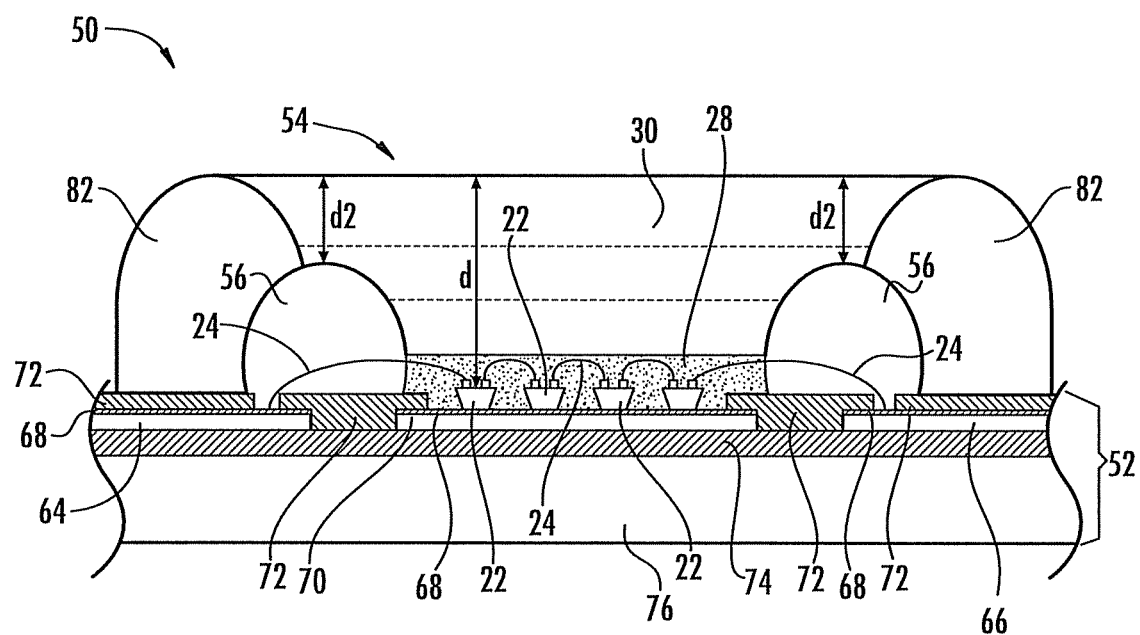

FIGS. 5 to 7 are cross-sections of light emitter device 50 which illustrate various locations, configurations, or arrangements of encapsulant layer 28 and clear layer 30 within emission area 54. The arrangements of encapsulant layer 28 and clear layer 30 shown and described in FIGS. 5 to 7 are equally applicable to device 10 (FIGS. 1 and 2) as well as any other emitter devices or embodiments, such as SMD type devices, however, for illustration purposes only device 50 has been illustrated in such numerous embodiments. Notably, devices described herein can incorporate one or more discrete optically clear layers of silicone, epoxy, or glass material for improving light output from such devices.

As FIG. 5 illustrates, more than one optically clear layer can be provided and applied to devices described herein. For example, device 50 can comprise a filling material disposed within emission area 54, where the filling material can comprise a phosphor containing encapsulant layer 28 and a first layer of optically clear material such as previously described clear layer 30. Filling material can also comprise a second layer of optically clear filling material or second clear layer 80 such that filling material comprises three or more physically discrete or separate layers disposed within the walls of retention material 56. Second clear layer 80 can, but does not have to, comprise the same material as first layer 30. That is, second clear layer 80 can comprise a layer of any suitable epoxy, silicone, or glass material. In one aspect, second clear layer 80 can comprise a low RI silicone material having a RI of approximately 1.4 or less, a medium RI material having a RI of approximately 1.4 to 1.5, or a high RI silicone material having a RI of approximately 1.5 or more. Encapsulant layer 28 can also comprise the same materials as first and second clear layers 30 and 80, respectively, but can also include one or more phosphors as denoted by the shaded or speckled appearance. In other aspects, each of the layers can comprise different materials, for example, a first layer can comprise a low RI encapsulant, a second layer can comprise a high RI silicone, and a third layer can comprise a medium RI silicone or an epoxy or glass material. In further aspects, tow of the layers can comprise the same material and one of the layers can comprise a different material. Any arrangement of layers and/or materials is contemplated herein. Emission area 54 can be filled to a level that is substantially flush with an upper surface of retention material 56 or over-filled or under-filled such that layers form a concave or convex surface. Notably, the height of retention material 56 can be increased such that distance d between the LED chip 22 and air interface can be increased to accommodate more than one optically clear layer of material within emission area 54. In one aspect, retention material 56 can be increased between approximately 0.2 and 0.5 mm to accommodate each additional clear layer. That is, retention material 56 can be increased approximately 0.6 to 1.0 mm where two or more clear layers are provided in device 50 and retention material 56 can be increased approximately 0.9 to 1.5 mm where three or more clear layers are provided.

Any percentage of encapsulant layer 28, clear layer 30, and second layer 80 can be deposited within a volume of emission area 54. For example and in one aspect, the volume of emission area 54 can be approximately 33% filled with each layer. In other aspects, the volume of emission area 54 can be approximately 20% filled with encapsulant layer 28 and approximately 40% filled with each of clear layer 30 and second clear layer 80 such that approximately 100% of the emission area is filled. In other aspects, the volume of emission area 54 can be approximately 50% filled with encapsulant layer 28 and approximately 25% filled with each of clear layer 30 and second clear layer 80 such that approximately 100% of the emission area 54 is filled. In further aspects, the volume of emission area 54 can be approximately 40% filled with encapsulant layer 28 and approximately 30% filled with each of clear layer 30 and second clear layer 80 such that approximately 100% of the emission area is filled. The clear layers do not have to be equal in thickness and/or of the same volumetric percentage, for example, the volume of emission area 54 can be approximately 25% filled with encapsulant layer 28, approximately 25% filled with clear layer 30, and approximately 50% filled with second clear layer 80. Layers 28, 30, and 80 can occupy any percentage and/or volume of emission area 54 and can be deposited in any order within emission area. Layers 28, 30, and 80 can be optionally cured during the same curing step, or each layer can be separately and optionally cured at different curing steps.

FIG. 6 illustrates an embodiment where phosphor containing encapsulant layer 28 is disposed between more than one optically clear layer of filling material. For example, a first optically clear layer 30 can be dispensed within emission area 54 first. In one aspect, clear layer 30 can be dispensed such that it covers wire bonds 24. Phosphor containing encapsulant layer 28 can be arranged and subsequently dispensed such that it covers clear layer 30. Second clear layer 80 can be arranged and subsequently dispensed over encapsulant layer 28 such that encapsulant layer 28 is disposed between more than one clear layer. Any percentage of encapsulant layer 28, clear layer 30, and second layer 80 can be deposited within emission area 54, such as percentages previously noted. Distance d can be increased to accommodate more than one clear layer of filling material, for example, by increasing the height of retention material 56.

FIG. 7 illustrates an embodiment where a secondary dam member or material 82 can be used to increase the distance between the LED chip 22 and air interface. For example, secondary dam 82 can be dispensed or otherwise deposited or positioned along outer edges of retention material 56 such that the distance d between an LED chip 22 and air interface increases by a distance d2, which is the difference in height between secondary dam 82 and retention material 56. In one aspect for example, distance d2 can comprise an increase in height of between approximately 0.2 and 0.5 mm for each additional clear layer to be used in device 50. That is, secondary dam 82 can be adapted to increase distance d by a distance d2 of approximately 0.6 to 1.0 mm where two or more clear layers are provided in device 50 and by a distance d2 of approximately 0.9 to 1.5 mm where three or more clear layers are provided. That is, secondary dam 82 can be approximately 0.2 to 1.5 mm taller than retention material 56. Encapsulant layer 28 can be dispensed within retention are 54 first and optionally cured prior to deposition of one or more subsequent optically clear layers of material, or can be optionally cured at the same time as other discrete and subsequently applied layers in one curing step. At least one additional layer of optically clear filling material or clear layer 30 can be disposed above encapsulant layer 28. As the broken lines indicate, more than one discrete layer of optically clear material can be applied to emission area 54, for example, two or more clear layers can be applied.

Figure 8:
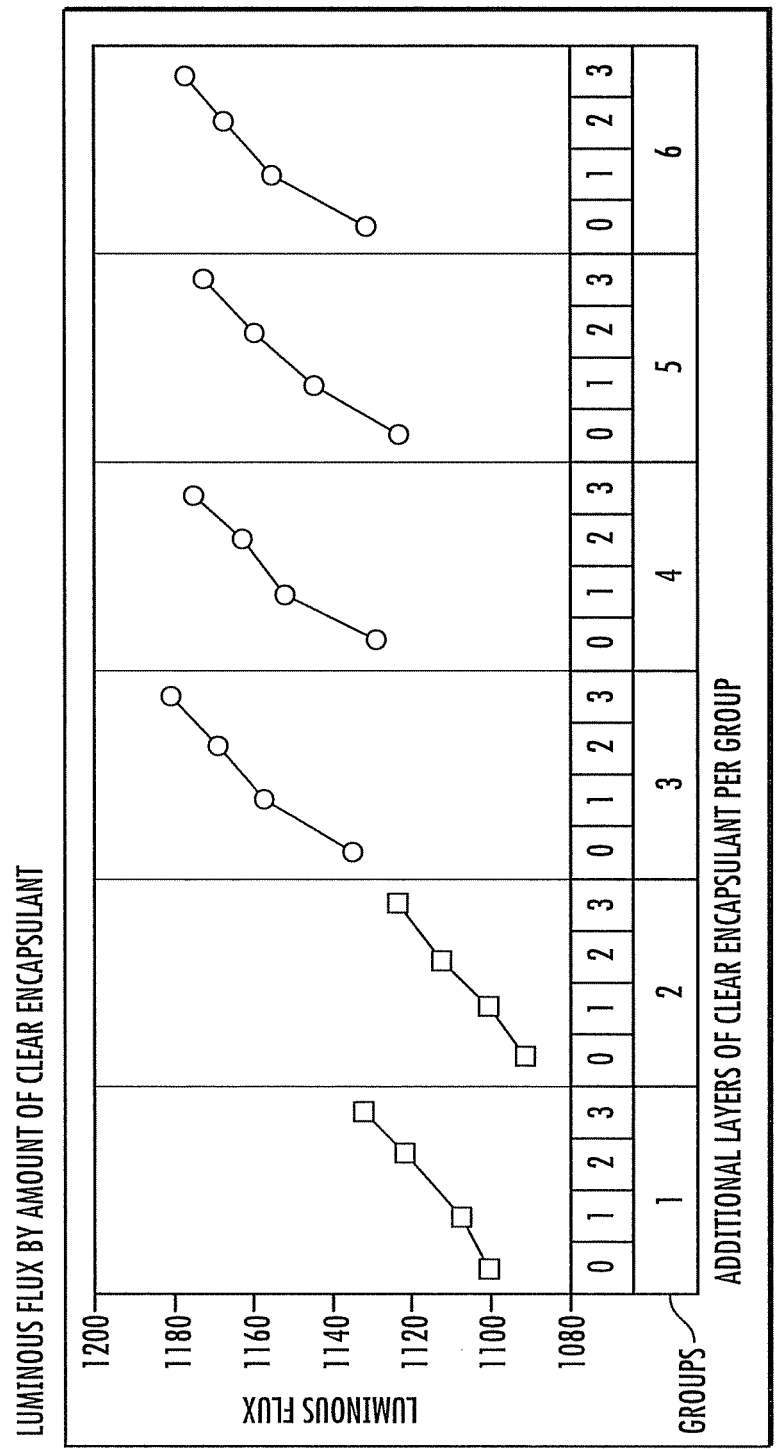
FIG. 8 is a graphical illustration of improved light output for light emitter devices according to the disclosure herein.

FIG. 8 is a graphical illustration of improved light output for devices disclosed herein which can incorporate one or more discrete clear layers of optical material in addition to a layer of phosphor containing encapsulant material. In one aspect, devices incorporating the one or more clear layers of material can comprise a larger distance d (FIGS. 2 and 4-7) between an LED chip 22 and an air interface. In FIG. 8, six different variability charts representing six different groups of devices tested illustrate the improvement in light output when moving from zero clear layers (e.g., conventional packages identified as "0" in each of the six groups/charts) to three clear layers (e.g., identified as "3" in each of the six groups/charts). In one aspect for example, each additional clear layer can add between approximately 0.2 and 0.5 mm to the overall, total distance d between the LED chips 22 and air interface. The first two groups include data obtained from using a low RI silicone in an initial layer (e.g., encapsulant layer 28, FIGS. 2 and 4-7) and a low RI for subsequent dispenses of each of the one or more additional clear layers of material (e.g., clear layer 30 and/or 80 FIGS. 2 and 4-7). Groups numbered 3 through 6 and respective charts include data obtained from using a high RI silicone in the initial layer (e.g., encapsulant layer 28, FIGS. 2 and 4-7) and a low RI for subsequent dispenses of each of the one or more additional clear layers of material (e.g., clear layer 30 and/or 80 FIGS. 2 and 4-7).

As FIG. 8 illustrates, luminous flux, or brightness increases linearly as the number of clear layers used in the device increases, which also can correspond to an increased distance d (FIGS. 2 and 4-7) between the LED chip 22 and air interface. In one aspect, light output of devices described herein can increase by more than 3% when one or more clear layers are separately dispensed and/or discretely applied within the device. For example, light output can increase by at least approximately 3.6% as illustrated by the groups 1 and 2, where three discrete clear layers improved the luminous flux from approximately 1100 lumens (lm) to approximately 1140 lm. In one aspect, each additional clear layer increased light output by approximately 0.85 to 1.25%. Charts for groups 3 through 6 indicate that packages using a high RI silicone in the initial encapsulant layer (e.g., layer 28 FIGS. 2, 4-7) can emit more light than packages using low RI silicone in the initial layer. Charts for groups 3 through 6 illustrate light increases per package that are greater than approximately 4%, for example, greater than approximately 4.5% and greater than approximately 5% as light output increases from approximately 1120 lm to approximately 1180 lm. In one aspect, each additional clear layer increased light output by approximately 0.75 to 1.75%.

As FIG. 8 further illustrates, packages comprising one or more layers of optically clear material can for example comprise a light output of approximately 1150 to 1190 lm. For example, packages comprising one layer of optically clear material can for example comprise a light output of between approximately 1150 and 1160 lm. Packages comprising two layers of optically clear material can for example comprise a light output of between approximately 1160 and 1170 lm. Packages comprising three layers of optically clear material can for example comprise a light output of between approximately 1170 to 1190 lm. As FIG. 8 illustrates, luminous flux can increase linearly, for example by approximately 1% or more, with an increasing distance between LED chips and an air interface (e.g., by increasing the number of clear layers), with gains in excess of 5% being demonstrated. The luminous flux values obtained for each variability chart can be measured at 270 mA.

Embodiments of the present disclosure shown in the drawings and described above are exemplary of numerous embodiments that can be made within the scope of the appended claims. It is contemplated that the configurations of light emitter devices having improved light output and related methods can comprise numerous configurations other than those specifically disclosed, including combinations of those specifically disclosed.

What is claimed is:

1. A light emitter device comprising:
   a light emission area comprising one or more light emitting chips; and
   a filling material at least partially disposed over the one or more light emitting chips, wherein the filling material comprises:
      a first discrete layer of phosphor containing material; and
      second and third discrete layers of optically clear material; and
   wherein the first discrete layer of phosphor containing material is disposed between and contacts each of the second and third discrete layers of optically clear material, wherein the second discrete layer of optically clear material contacts the one or more light emitter chips, and wherein each of the first, second, and third discrete layers of material are approximately a same thickness.

2. The device of claim 1, wherein the first discrete layer of phosphor containing material comprises one or more phosphors disposed in a low refractive index (RI) silicone encapsulant having a RI of approximately 1.4 or less.

3. The device of claim 1, wherein the first discrete layer of phosphor containing material comprises one or more phosphors disposed in a high refractive index (RI) silicone encapsulant having a RI of approximately 1.5 or more.

4. The device of claim 1, wherein the first discrete layer of phosphor containing material comprises one or more phosphors disposed in a medium refractive index (RI) silicone encapsulant having a RI of approximately 1.4 to 1.5.

5. The device of claim 1, wherein the second and third discrete layers of optically clear material comprise a silicone, epoxy, or glass material.

6. The device of claim 5, wherein the silicone material comprises a low refractive index (RI) silicone encapsulant having a RI of approximately 1.4 or less.

7. The device of claim 5, wherein the silicone material comprises a high refractive index (RI) silicone encapsulant having a RI of approximately 1.5 or more.

8. The device of claim 5, wherein the silicone material comprises a medium refractive index (RI) silicone encapsulant having a RI of approximately 1.4 to 1.5.

9. The device of claim 1, wherein each of the second and third discrete layers of optically clear material increases a distance between the one or more light emitting chips and an air interface by approximately 0.2 and 0.5 mm.

10. The device of claim 1, wherein a distance between the one or more light emitting chips and an air interface can be increased to approximately 2 mm by increasing one or more walls of the light emission area by approximately 0.2 mm to 1.5 MM.

11. The device of claim 1, wherein a retention material is disposed about the light emission area.

12. The device of claim 11, wherein a distance between the one or more light emitting chips and an air interface is increased by a secondary dam dispensed about the retention material.

13. The device of claim 12, wherein the secondary dam is taller than the retention material.

14. The device of claim 5, wherein the third discrete layer of optically material comprises glass.

15. The device of claim 1, wherein each of the discrete layers of material is approximately 0.2 millimeters (mm) to 0.4 mm thick.

16. The device of claim 1, further comprising a fourth discrete layer of phosphor containing material.

17. The device of claim 1, wherein the light emission area comprises a cavity with the one or more light emitting chips disposed therein.

18. The device of claim 17, wherein the cavity comprises a cavity volume and approximately 50% of the cavity volume is filled with the first discrete layer of material, approximately 25% of the cavity volume is filled with the second discrete layer of material, and approximately 25% of the cavity volume is filled with the third discrete layer of material.

19. The device of claim 17, wherein the cavity comprises a cavity volume and approximately 40% of the cavity volume is filled with the first discrete layer of material, approximately 30% of the cavity volume is filled with the second discrete layer of material, and approximately 30% of the cavity volume is filled with the third discrete layer of material.

20. The device of claim 1, wherein the device comprises a light output of approximately 1160 to 1190 lumens (lm) at 270 mA.

21. A light emitter device comprising:
a light emission area comprising a cavity with one or more light emitting chips disposed therein; and
a filling material at least partially disposed over the one or more light emitting chips, wherein the filling material comprises:
 a first discrete layer of phosphor containing material; and
 a plurality of discrete layers of optically clear material, wherein each of the plurality of layers comprises a same refractive index (RI) value of between approximately 1.4 and 2.0;
wherein the cavity comprises a cavity volume and at least approximately 25% of the cavity volume is filled with the first discrete layer of material and at least approximately 25% of the cavity volume is filled with the plurality of discrete layers of optically clear material.

22. The device of claim 21, wherein approximately 50% of the cavity volume is filled with the first discrete layer of material and approximately 50% of the cavity volume is filled with the plurality of discrete layers of optically clear material.

23. The device of claim 21, wherein approximately 25% of the cavity volume is filled with the first discrete layer of material and approximately 75% of the cavity volume is filled with the plurality of discrete layers of optically clear material.

24. The device of claim 21, wherein approximately 75% of the cavity volume is filled with the first discrete layer of material and approximately 25% of the cavity volume is filled with the plurality of discrete layers of optically clear material.

25. The device of claim 21, further comprising a plurality of discrete layers of phosphor containing material.

26. The device of claim 25, wherein the plurality of discrete layers of phosphor containing material alternate with the plurality of discrete layers of optically clear material within the cavity.

27. A light emitter device comprising:
a light emission area comprising one or more light emitting chips; and
a filling material at least partially disposed over the one or more light emitting chips, wherein the filling material comprises:
 a first discrete layer of phosphor containing material contacting the one or more light emitter chips; and
 a second discrete layer of optically clear material;
 wherein the second discrete layer of optically clear material is disposed directly over an upper surface of the first discrete layer of phosphor containing material; and
 wherein the first and second discrete layers of material are approximately a same thickness.

28. The device of claim 27, wherein the first discrete layer of phosphor containing material comprises one or more phosphors disposed in a low refractive index (RI) silicone encapsulant having a RI of approximately 1.4 or less.

29. The device of claim 27, wherein the first discrete layer of phosphor containing material comprises one or more phosphors disposed in a high refractive index (RI) silicone encapsulant having a RI of approximately 1.5 or more.

30. The device of claim 27, wherein the first discrete layer of phosphor containing material comprises one or more phosphors disposed in a medium refractive index (RI) silicone encapsulant having a RI of approximately 1.4 to 1.5.

31. The device of claim 27, wherein the second discrete layer of optically clear material comprises a silicone, epoxy, or glass material.

32. The device of claim 31, wherein the silicone material comprises a low refractive index (RI) silicone encapsulant having a RI of approximately 1.4 or less.

33. The device of claim 31, wherein the silicone material comprises a high refractive index (RI) silicone encapsulant having a RI of approximately 1.5 or more.

34. The device of claim 31, wherein the silicone material comprises a medium refractive index (RI) silicone encapsulant having a RI of approximately 1.4 to 1.5.

35. The device of claim 27, wherein a retention material is disposed about the light emission area.

36. The device of claim 35, wherein a distance between the one or more light emitting chips and the air interface is increased by a secondary dam dispensed about the retention material.

37. The device of claim 27, wherein filling material comprises a third discrete layer of optically clear material.

38. The device of claim 37, wherein the third discrete layer of optically clear material comprises glass.

39. The device of claim 27, wherein the light emission area comprises a cavity with the one or more light emitting chips disposed therein.

40. The device of claim 39, wherein the cavity comprises a cavity volume and approximately 25% of a cavity volume is filled with the first discrete layer of phosphor containing material and approximately 75% of the cavity volume is filled with the second discrete layer of phosphor containing material.

41. The device of claim 39, wherein the cavity comprises a cavity volume and approximately 75% of the cavity volume is filled with the first discrete layer of phosphor containing material and approximately 25% of the cavity volume is filled with the second discrete layer of phosphor containing material.

42. The device of claim 27, wherein the device comprises a light output of approximately 1160 to 1190 lumens (lm) at 270 mA.

* * * * *